United States Patent [19]

Reimer et al.

[11] 3,932,012

[45] Jan. 13, 1976

[54] COMPONENT TERMINAL SYSTEM

[75] Inventors: William A. Reimer, Wheaton; Elmer L. Scheuerman, Des Plaines, both of Ill.

[73] Assignee: GTE Automatic Electric Laboratories Incorporated, Northlake, Ill.

[22] Filed: Sept. 27, 1974

[21] Appl. No.: 509,878

[52] U.S. Cl. .......................... 339/17 CF; 339/95 B
[51] Int. Cl.² ..................... H05K 1/00; H01R 11/20
[58] Field of Search ............ 339/17 R, 17 C, 17 CF, 339/17 L, 95 B; 317/101 CC

[56] References Cited
UNITED STATES PATENTS

| | | | |
|---|---|---|---|
| 3,644,792 | 2/1972 | Fields | 339/17 C |
| 3,646,582 | 2/1972 | Van Alphen et al. | 339/95 B |
| 3,681,743 | 8/1972 | Townsend | 339/17 R X |
| 3,732,529 | 5/1973 | Weisenburger | 339/17 CF X |
| 3,745,510 | 7/1973 | Mallon | 339/17 R |
| 3,825,876 | 7/1974 | Damon et al. | 339/17 CF |
| 3,866,999 | 2/1975 | Doherty | 339/17 CF |

FOREIGN PATENTS OR APPLICATIONS

| | | | |
|---|---|---|---|
| 1,564,073 | 4/1960 | France | 317/101 CC |

*Primary Examiner*—Joseph H. McGlynn
*Assistant Examiner*—Craig R. Feinberg

[57] ABSTRACT

This invention relates to a component terminal system adapted to receive a combination of integrated circuits and individual discrete components. The terminal system includes a circuit terminal projecting above a frame to which a circuit connection may be made. A second terminal projects inward from the adjacent side of the frame and forms a V-shaped trough for receiving the wire leads from the integrated circuit and/or discrete components. A bus strap may be placed on the top and/or the bottom of the mounting panel and a pin may be inserted through the mounting panel making contact to the respective bus to provide a connection point between the bus and the circuit terminals.

6 Claims, 9 Drawing Figures

COMPONENT TERMINAL SYSTEM

BACKGROUND OF THE INVENTION

1. Field of the Invention

The present invention relates generally to sockets for electronic components and more particularly to a socket adapted to receive a mixture of integrated circuits and individual discrete components.

2. Description of the Prior Art

In currently available discrete component and integrated circuit sockets, the circuit pins are forced against spring members in the socket thereby forming a conductive path between the mating pin and the socket member. The quality of this conductive path is entirely dependent on the material involved in the mating surfaces and the forces involved. Because circuit pin contact surface metallurgy has not been standardized for the industry and the amount of force that can be applied is limited by practical considerations, poor quality connections often result when devices are mounted in sockets.

Another limitation inherent in the design of the socket is its inability to serve as a combination socket for an integrated circuit and individual discrete electronic components. Sockets are generally made to mount one device of a specific configuration thereby preventing application flexibility from a single socket design.

Further limitations result because lead diameter of most discrete electronic components differ among themselves and with that of the typical integrated circuit lead thereby preventing a good electrical contact without breaking or permanently deforming the socket contact and certainly preventing the reuse of the socket to hold an integrated circuit after a discrete component was previously mounted therein.

Maximum packaging efficiency is not provided because, in the most common sockets for wrapped-wire terminations, the wrapped-wire is on one side of the mounting panel and the socket is on the other. Thus the wiring volume adds to the component volume, not to mention that it is often difficult and confusing to wire underneath the mounting board.

With the variable metallurgical content of the component terminals a solder termination is very desirable and in many instances mandatory to ensure a reliable circuit connection. With conventional socket arrangements, there is no means available to make a reliable solder connection between the component and the socket.

Finally, the current sockets are not capable of being used with automated circuit assembly equipment and in many instances require individual component insertion and wiring.

OBJECTS AND SUMMARY OF THE INVENTION

It therefore is a general object of the present invention to provide a new and unobvious electrical socket capable of accepting both integrated circuits and discrete components.

It is another object of the present invention to provide an electrical socket in which integrated circuits and individual discrete components are freely interchangeable within the socket.

It is another object of the present invention to provide an electrical socket which is capable of accepting multi-diameter lead wires.

Another object of the present invention is to provide an electrical socket which may be used with automated circuit assembly equipment.

Another object of the present invention is to provide an electrical socket providing access points whereby tests may be run after the component is inserted but before the component is permanently connected to the socket.

Another object of the present invention is to provide an electrical socket with connector terminals on the same side of the mounting board to which the socket is attached.

Another object of the present invention is to provide an electrical socket wherein solder terminations may be made between the component and the socket.

A further object of the present invention is to provide an electrical socket which does not physically deform the connector pins of the individual components during insertion of the component.

These and other objectives of the present invention are effectively achieved by providing an electrical socket in which a plurality of electrically conductive circuit terminals project. The terminals extend below the surface of the frame and either form or interconnect with the component terminals which extend inwardly from a surface orthogonally oriented with respect to the surface from which the circuit terminals project. The component terminals forms a V-shaped trough through which the component lead passes.

The frame supports two opposed parallel rows of terminals. The component terminals extending below the frame face inward towards each other.

The frame is secured in a mounting panel containing dual slots for the downwardly projecting component terminals and locating notches for providing the proper alignment of the socket on the mounting panel. The mounting panel may be a printed wiring card containing one or more buses.

Conductive pins may be inserted at opposite ends of the slots and solder terminated to one of the buses thereby providing an access point to the buses. In cases where a standard predetermined socket length is employed the dual slots at opposite ends are square-cornered thereby locking the socket onto the mounting panel.

The component body projects beyond the frame surface from which the wrapped-wire terminal extends in order to minimize the volume of the assembly.

This configuration is particularly well suited to be used withh automatic wiring machines and other automated methods of assembly and the configuration may be altered to allow the use of other wiring methods as they are developed.

The foregoing as well as other objects, features and advantages of the present invention will become more apparent from the following detailed description taken in conjunction with the appended drawings.

DESCRIPTION OF THE PREFERRED EMBODIMENT

Figure 1:
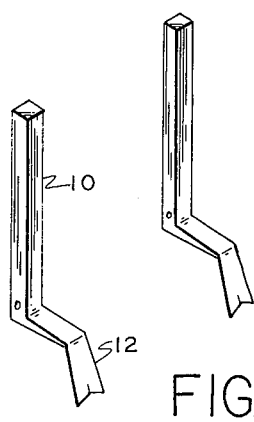
FIG. 1 is a perspective view of the terminals on which circuit connections are made to the upper half and the component attached to the lower half of the terminal.
Figure 2:
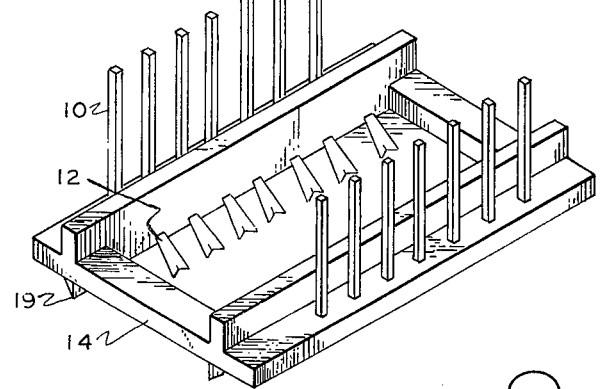
FIG. 2 is a perspective view of the fully assembled socket.

Turning now to FIGS. 1 and 2, the terminals consist of two sections, the top section 10 is formed from an electrically conductive metal bar which is adapted to receive wrapped-wire and other types of connections. The component portion 12 of the terminal is formed from a strap of metal or may be a flattened section of the wrapped-wire terminal with the bottommost extremity forming a V-shaped trough. Both sections of the terminal may be formed from the same stock piece of metal or may be separately formed and welded together.

The terminals are secured and positioned by frame 14. The frame is constructed of a rigid non-conductive material with its primary purpose being to insulate and firmly position the terminals in a specific configuration. The opposed rows of terminals are aligned so as to allow the circuit terminal 10 to project above and perpendicular to the frame 14 and the component terminal 12 to project downwardly and inwardly.

Figure 3:
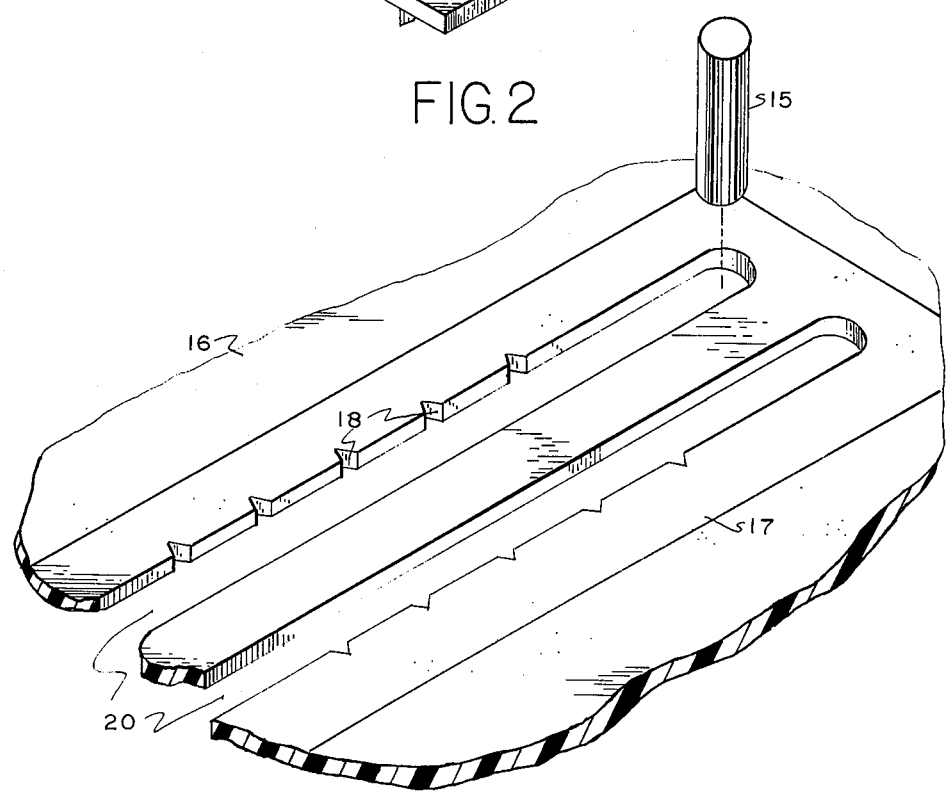
FIG. 3 is a partial perspective view of the mounting panel containing the slots locating notches, pin and plated bus, appropriate for mounting the socket of FIG. 2 of a variable length.

The overall socket configuration as illustrated in FIG. 2 is secured in a mounting panel 16 as shown in FIG. 3 containing a bus 17 and first and second parallel slots 20 for receiving the component terminals 12. The locating notches 18 mate with the respective indexing projections 19 on the frame 14 which provide proper alignment of the socket on the mounting panel. The indexing projections 19 may be secured to the notches 18 in the mounting panel 16 by heat, ultrasonic or standard adhesives. A pin 15 is inserted at the opposite end of the slots and makes an electrical connection to one bus. In instances where more than one bus 17 is employed, all conductive material forming the bus in close proximity to the pin and which it is not desired to make an electrical contact with the pin is removed thereby preventing any possibility of a short circuit.

The mounting panel 16 may be constructed of a rigid non-conductive sheet or a printed wiring card containing one or more power planes. If the printed wiring card with multiple power planes is used the circuit wiring could be significantly decreased by making a direct connection from the terminal to the appropriate power plane via the appropriate pin 15.

Figure 4:
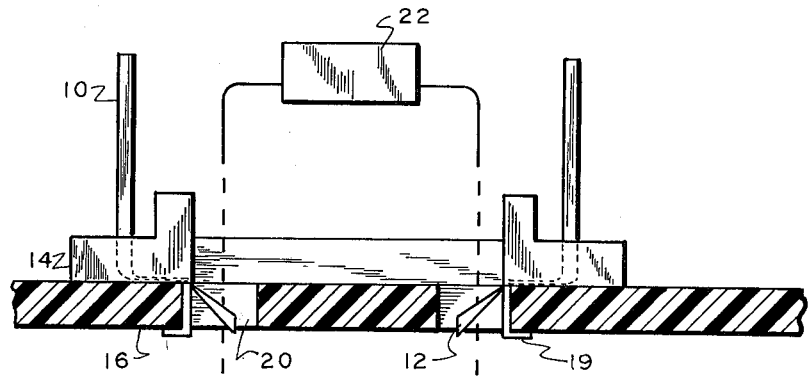
FIG. 4 is an end view of the socket secured to a mounting panel illustrating the positioning of an individual discrete component prior to insertion.
Figure 5:
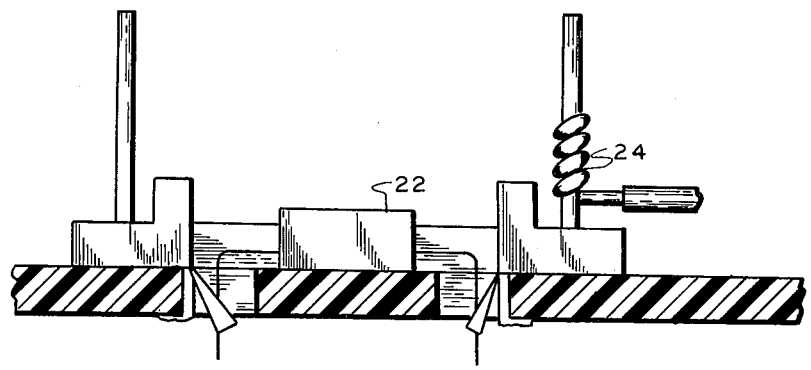
FIG. 5 is a cross-section end view of the socket secured to a mounting panel illustrating the position of a component with its leads in contact with the terminals and an electrical connection to the upper half of the terminal.
Figure 6:
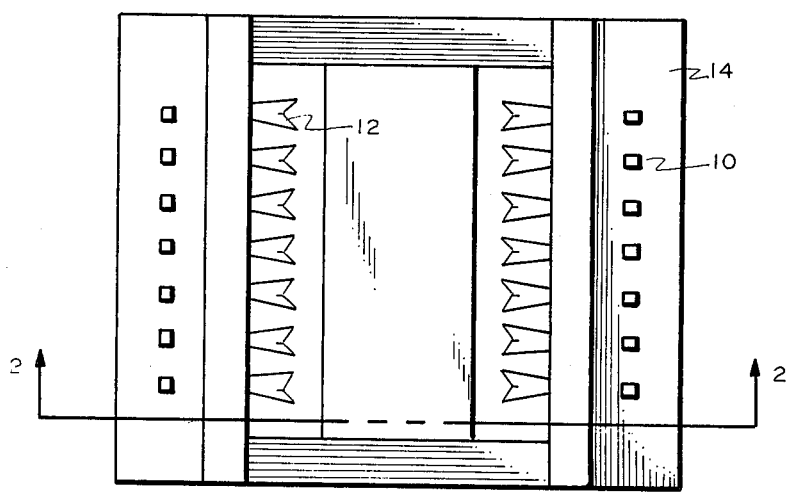
FIG. 6 is a top view of the socket with a cross-sectional line 2 at the cross-section point of FIG. 5.
Figure 7:
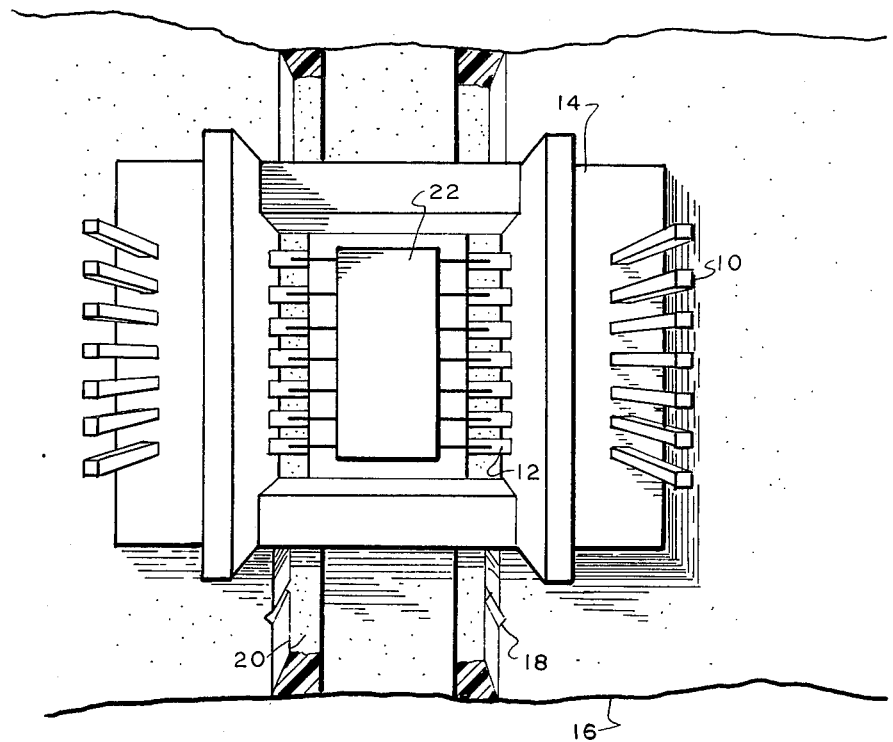
FIG. 7 is a top view of the socket with an integrated circuit mounted in the socket.

As illustrated in FIGS. 4, 5 and 7, an individual discrete component or integrated circuit 22 may be mounted in the socket. The wire terminals of the component 22 are physically formed so as to permit their insertion through slots 20 and contact the lower portions of the terminals 12. When the component leads are inserted into the terminals lower portion 12, the V-shaped structure funnels the component lead to the center of the terminal thereby providing a combination of faces from the terminal and the component lead to establish a reliable connection. After all components have been inserted in the terminals a solder connection may be made using an automated method employing wave soldering. However, if ease of component replacement or further testing is desired, the solder connection would not be necessary. A circuit connection may be made on the wrapped-wire terminal 10 if automated assembly methods are employed a wrapped-wire connection 24 may be used as illustrated in FIG. 5.

While the drawings display a socket containing seven terminals per side, actually the number of terminals on the socket is variable and where it is desired to mount a combination integrated circuit and a discrete component the number of terminals may be expanded. Further in cases where at a later time discrete components may be replaced by an integrated circuit on the same socket, the number of terminals might be crucial, therefore a socket containing more than the seven displayed would be desired.

The circuit terminals 12 are adapted to receiving wiring terminations by using many methods of terminating, including but not limited to wrapped-wire, solder, clamping, twisting and termipoint.

Figure 8:
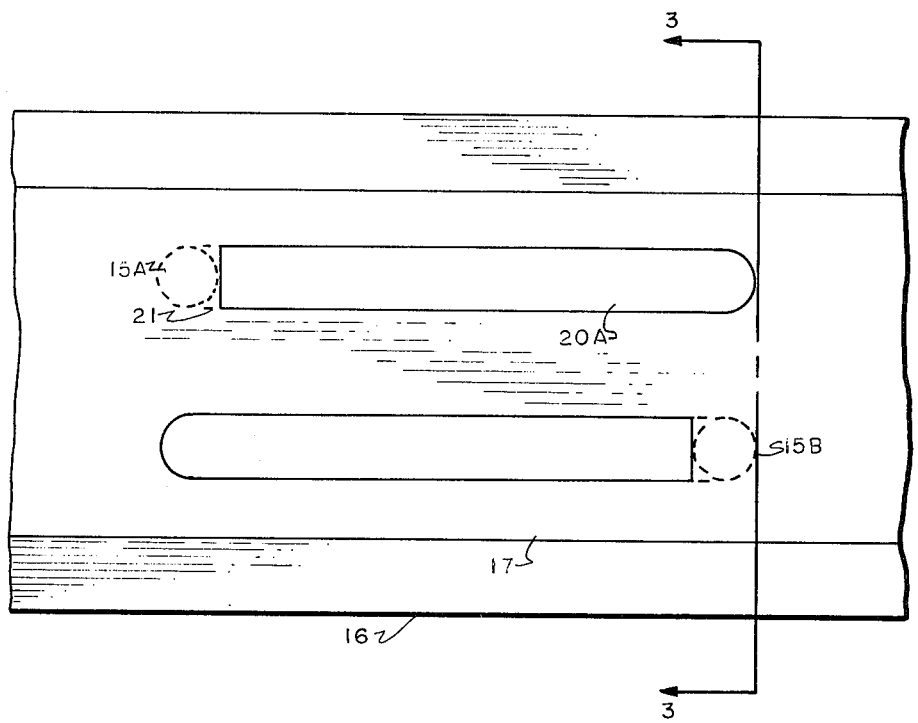
FIG. 8 is a top view of the mounting panel with dual slots for a predetermined socket length, a bus on the surface of the mounting panel and a dotted area representing the location of the pins and a cross-sectional line 3 at the cross-section point of FIG. 9.
Figure 9:
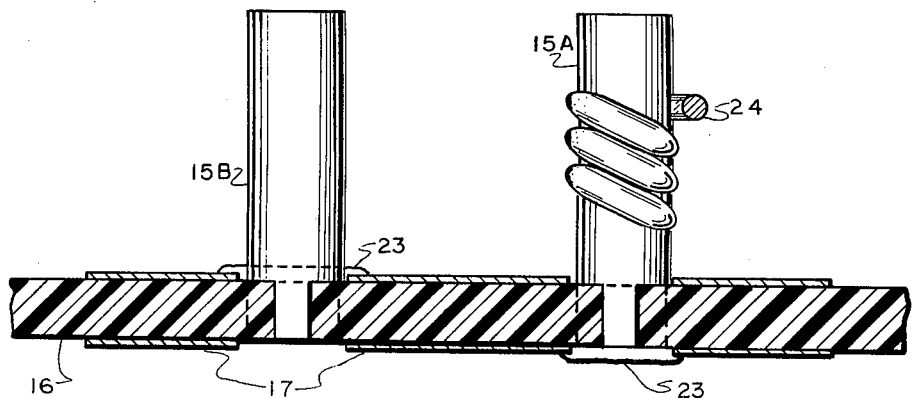
FIG. 9 is an end cross-section view of the mounting panel containing a bus on both sides of the panel with the pins mounted at both ends of the slots and making an electrical connection to a bus with a connection made to one of the pins from a circuit terminals.

As illustrated in FIGS. 8 and 9 the mounting panel 16 may be a printed wiring card containing one or more buses 17. In instances where the exact length of the socket is known the dual slots 20A may be overlapping with opposite ends forming a square corner 21 as illustrated in FIG. 8 thereby preventing any longitudinal movement of the socket. Further pins 15A and 15B may be inserted into the mounting panel and make an electrical contact with the respective bus 23. A connection 24 is then made possible from the circuit terminal 10 as illustrated in FIG. 5 to the respective pin as illustrated in FIG. 9.

From the foregoing it will be seen that the Applicant has provided an improvement in integrated circuit and discrete component mounting sockets whereby the objectives set forth above are efficiently met. Since certain changes in the abovedescribed construction will occur to those skilled in the art without departure from the scope of the invention it is intended all matter contained in the preceding description or shown in the appended drawings shall be interpreted as illustrative and not in a limiting sense.

Having described what is new and novel and desired to secure by Letters Patent, what is claimed is:

1. Apparatus for terminating integrated circuits and discrete components, said apparatus comprising:
   an electrically insulative frame;
   a plurality of electrically conductive terminals, said terminals passing through said insulative frame and extending from a first face thereof to form circuit terminals and from the adjacent inside face thereof to form component terminals, said component terminals comprised of a rectangular shaped conductive strip, said strip containing a V-shaped trough passing through its length to provide component terminal lead alignment, said circuit terminals comprise a metal bar to which wrapped-wire and other types of circuit connections may be made, said component terminal comprise an extension of said circuit terminal, wherein said extension is flattened to form a flat strap and forms a short section perpendicular to said circuit terminal, whereafter said strap extends beyond the inside edge of said frame in a downward and inward direction toward the center of said frame, said terminals being adapted to receive integrated components and discrete components interchangeably and at the same time, said circuit terminals form parallel first and second rows projecting from said first face of said frame, said second row of said circuit terminals being directly opposite said first row, said component terminals forming a first and second row projecting inward and downward from the respective adjacent faces of said first and second rows of said circuit terminals, and a mounting panel, said mounting panel comprising dual slots for the projection of the component terminals below said frame and said mounting panel, said mounting panel constructed of insulative material and including at least one locating notch positioned on the edge of said slots to provide proper alignment of said frame on said mounting panel.

2. Apparatus for terminating integrated circuits and discrete components as claimed in claim 1, wherein said mounting panel further includes:

at least one bus, said mounting panel, further including at least one pin positioned upon said mounting panel and making electrical contact with said bus whereby access points are provided to said bus from said circuit terminals.

3. Apparatus for terminating integrated circuits and discrete components as claimed in claim 2 wherein said mounting panel further includes:

said dual slots for a predetermined socket length, having one circular end and one square end disposed oppositely, wherein longitudinal distance between the square ends of said slots would be equal to the length of the frame, said mounting panel further including pins positioned on said panel making electrical contact with said bus, said pins providing an access to said bus from said circuit terminals.

4. Apparatus for terminating integrated circuits and discrete components, said apparatus comprising:

an electrically insulative frame;

a plurality of electrically conductive terminals, said terminals passing through said insulative frame and extending from a first face thereof to form circuit terminals and from the adjacent inside face thereof to form component terminals, said component terminals comprised of a rectangular shaped conductive strip, said strip containing a V-shaped trough passing through its length to provide component terminal lead alignment, said circuit terminals comprise a metal bar to which wrapped-wire and other types of circuit connections may be made, said component terminals further comprise a flat rectangular strap of electrically conductive material making an electrical connection to said circuit terminals, extending from said circuit terminals through said frame, whereafter said strap extends beyond the inside edge of said frame in a downward and inward direction towards the center of said frame, said strap contains a V-shaped trough passing through its length to provide terminal, lead alignment, said terminals being adapted to receive integrated components and discrete components interchangeably and at the same time, said circuit terminals form parallel first and second rows projecting from said first face of said frame, said second row of said circuit terminals being directly opposite said first row, said component terminals forming a first and second row projecting inward and downward from the respective adjacent faces of said first and second rows of said circuit terminals, and a mounting panel, said mounting panel including dual slots for the projection of the component terminals below said frame and said mounting panel, said mounting panel constructed of insulative material and containing at least one locating notch positioned on the edge of said slots to provide proper alignment of said frame on said mounnting panel.

5. Apparatus for terminating integrated circuits and discrete components as claimed in claim 4, wherein said mounting panel further includes:

at least one bus, said mounting panel further including at least one pin positioned upon said mounting panel and making electrical contact with said bus whereby access points are provided to said bus from said circuit terminals.

6. Apparatus for terminating integrated circuits and discrete components as claimed in claim 5 wherein said mounting panel further includes:

said dual slots for a predetermined socket length, having one circular end and one square end disposed oppositely, wherein longitudinal distance between the square ends of said slots would be equal to the length of the frame, said mounting panel further including pins positioned on said panel making electrical contact with said bus, said pins providing an access to said bus from said circuit terminals.

* * * * *